(12) United States Patent
Lee et al.

(10) Patent No.: US 8,766,355 B2
(45) Date of Patent: Jul. 1, 2014

(54) SEMICONDUCTOR TRENCH ISOLATION INCLUDING POLYSILICON AND NITRIDE LAYERS

(75) Inventors: Dong-kak Lee, Seoul (KR); Hee-don Hwang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 46 days.

(21) Appl. No.: 13/225,896

(22) Filed: Sep. 6, 2011

(65) Prior Publication Data

US 2012/0056263 A1  Mar. 8, 2012

(30) Foreign Application Priority Data

Sep. 8, 2010 (KR) .................. 10-2010-0088046

(51) Int. Cl.
*H01L 29/06* (2006.01)
*H01L 29/78* (2006.01)

(52) U.S. Cl.
USPC .............. 257/330; 257/E29.02; 257/E29.255; 257/E29.262

(58) Field of Classification Search
USPC ........... 257/330, 368, 506, E29.02, E29.255, 257/E29.262
See application file for complete search history.

(56) References Cited

U.S. PATENT DOCUMENTS

| 3,313,013 | A | | 4/1967 | Last |
| 4,666,556 | A | | 5/1987 | Fulton et al. |
| 5,631,189 | A | * | 5/1997 | Kobayashi et al. ........... 438/448 |
| 6,140,691 | A | | 10/2000 | Gardner et al. |
| 6,683,364 | B2 | | 1/2004 | Oh et al. |
| 6,690,080 | B2 | | 2/2004 | Norström et al. |
| 6,699,799 | B2 | | 3/2004 | Ahn et al. |
| 6,740,955 | B1 | * | 5/2004 | Hong et al. ................... 257/506 |
| 7,268,055 | B2 | | 9/2007 | Chien et al. |
| 7,351,634 | B2 | * | 4/2008 | Su et al. ........................ 438/243 |
| 8,125,044 | B2 | * | 2/2012 | Gogoi ........................... 257/500 |
| 2008/0061398 | A1 | | 3/2008 | Nagura |

FOREIGN PATENT DOCUMENTS

| KR | 98-6030 A | 3/1998 |
| KR | 10-2006-0002057 A | 1/2006 |
| KR | 10-2006-0105852 A | 10/2006 |

* cited by examiner

*Primary Examiner* — Matthew W Such
*Assistant Examiner* — Monica D Harrison
(74) *Attorney, Agent, or Firm* — Myers Bigel Sibley & Sajovec, P.A.

(57) ABSTRACT

A semiconductor device includes a device isolation pattern in which a polysilicon layer pattern doped with oxygen, carbon or nitrogen is interposed between an inner wall of a trench and a nitride liner. The semiconductor device includes a semiconductor substrate including a trench, a polysilicon layer pattern on a surface of the trench, a nitride layer pattern on the polysilicon layer pattern, and an insulation layer pattern on the nitride layer pattern and filling the trench. The polysilicon layer pattern may be doped with oxygen, carbon and/or nitrogen. Related manufacturing methods are also disclosed.

11 Claims, 17 Drawing Sheets

SEMICONDUCTOR TRENCH ISOLATION INCLUDING POLYSILICON AND NITRIDE LAYERS

CROSS-REFERENCE TO RELATED APPLICATION

This application claims the benefit of Korean Patent Application No. 10-2010-0088046, filed on Sep. 8, 2010, in the Korean Intellectual Property Office, the disclosure of which is incorporated herein in its entirety by reference.

BACKGROUND

Various embodiments described herein relate to semiconductor devices and methods of manufacturing the same, and more particularly, to semiconductor devices having device isolation patterns using a trench, and methods of manufacturing the semiconductor devices.

As the integration degree of semiconductor devices continues to increase, the design rules for components of the semiconductor device continue to be reduced. In particular, a gate length, which is a standard for the design rule of semiconductor devices that use a large number of transistors, continues to be reduced. The reduced gate length can deteriorate voltage and/or current characteristics of the semiconductor devices that are scaled down.

SUMMARY

Various embodiments described herein can provide structures of semiconductor devices that can reduce or prevent hot electron induced punch through (HEIP).

Various embodiments described herein can also provide methods of manufacturing semiconductor devices that can reduce or prevent HEIP.

Semiconductor devices according to various embodiments described herein comprise a semiconductor substrate including a trench therein, a polysilicon layer pattern on a surface of the trench, a nitride layer pattern on the polysilicon layer pattern remote from the surface of the trench, and an insulation layer pattern on the nitride layer pattern remote from the polysilicon layer pattern.

Semiconductor devices according to various other embodiments described herein comprise a semiconductor substrate including a trench therein, a gate electrode structure on the semiconductor substrate, and a device isolation pattern in the trench. The device isolation pattern comprises a polysilicon layer pattern on a surface of the trench, a nitride layer pattern on the polysilicon layer pattern remote from the surface of the trench, and an insulation layer pattern on the nitride layer pattern remote from the polysilicon layer pattern. The polysilicon layer pattern is doped with impurities.

Semiconductor devices according to still other embodiments described herein comprise a semiconductor substrate including a trench therein, a first conformal layer on the surface of the trench and a second conformal layer on the first conformal layer remote from the surface of the trench. The second conformal layer is configured to trap carriers of a first conductivity type, such as electrons, therein that pull carriers of a second conductivity type, such as holes, from the semiconductor substrate adjacent the surface of the trench into the first conformal layer. As used herein, a "conformal" layer means a layer having opposing surfaces that both conform to a contour of the underlying layer or region on which the conformal layer extends.

In some embodiments, the first conformal layer comprises polysilicon and the second conformal layer comprises nitride. The polysilicon may be doped and/or the first conformal layer may be recessed from an opening of the trench. An active semiconductor device may be provided in the semiconductor substrate adjacent the trench.

BRIEF DESCRIPTION OF THE DRAWINGS

Various embodiments described herein will be more clearly understood from the following detailed description taken in conjunction with the accompanying drawings in which.

DETAILED DESCRIPTION

Figure 1:
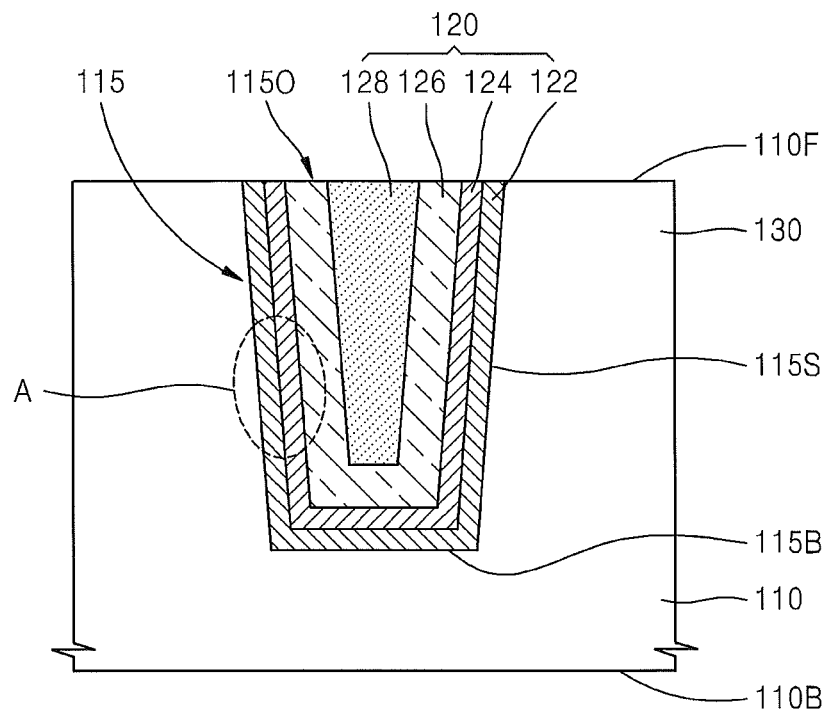
FIG. 1 is a cross-sectional view of a semiconductor device according to various embodiments described herein.

Various embodiments described herein will now be described more fully with reference to the accompanying drawings, in which exemplary embodiments of various inventive concepts are shown. The inventive concepts may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art. In the drawings, the thicknesses of layers and regions are exaggerated for clarity. Moreover, each embodiment described and illustrated herein includes its complementary conductivity type embodiment as well. Like numbers refer to like elements throughout.

It will be understood that when a component such as a layer, a region, or a substrate is referred to as being "on", "connected to", or "coupled to" another component throughout the specification, it can be directly "on", "connected to", or "coupled to" the other component, or intervening layers may also be present. On the other hand, when a component is referred to as being "directly on", "directly connected to", or "directly coupled to" another component, it will be understood that no intervening layer is present. Like reference numerals denote like elements. As used in the present specification, the term "and/or" includes any and all combinations of one or more of the listed items.

In the present description, terms such as 'first', 'second', etc. are used to describe various members, components, regions, layers, and/or portions. However, the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the teaching of the inventive concepts.

Relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "upper" side of other elements would then be oriented on "lower" sides of the other elements. The exemplary term "upper", can therefore, encompass both an orientation of "lower" and "upper", depending of the particular orientation of the figure. If the device is oriented in another direction, that is, rotated by 90° with respect to the direction, the description on the relative terms of the present specification can be understood accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

A semiconductor device may be divided into an active region in which unit devices are formed and a device isolation region that divides the unit devices. The device isolation region generally occupies a large portion of the entire surface area of the semiconductor device, and thus the device isolation region should be reduced to allow the high integration degree of the semiconductor device.

FIG. 1 is a cross-sectional view illustrating a semiconductor device according to various embodiments described herein.

Referring to FIG. 1, the semiconductor device includes a semiconductor substrate 110 including a trench 115 therein and a device isolation pattern 120 in the trench 115. The semiconductor substrate may comprise a single element and/or compound semiconductor substrate, such as a monocrystalline silicon substrate, and may include one or more epitaxial and/or other conductive/insulating layers thereon. The device isolation pattern 120 corresponds to a device isolation region of a semiconductor device, and a portion of the semiconductor substrate 110 defined between one device isolation pattern 120 and another adjacent device isolation pattern 120 corresponds to an active region 130 of the semiconductor device.

The device isolation pattern 120 may have, for example, a shallow trench isolation (STI) structure which has a small width and excellent device isolating characteristics at the same time.

The device isolation pattern 120 includes an oxide layer pattern 122 on surfaces 115S and 115B of the trench 115, a polysilicon layer pattern 124 on the oxide layer pattern 122 remote from the surfaces of the trench, a nitride layer pattern 126 on the polysilicon layer pattern 124 remote from the oxide layer pattern 122, and an insulation layer pattern 128 on the nitride layer pattern 126 remote from the polysilicon layer pattern 124. In some embodiments, the insulation layer pattern 128 fills the trench 115.

The nitride layer pattern 126 can reduce a junction leakage current connected to a capacitor, which can increase a retaining time of charges accumulated in the capacitor. Accordingly, refresh characteristics of the semiconductor device may be improved.

The surfaces 115S and 115B of the trench 115 may include a bottom surface 115B and a side surface 115S. The trench also may include a trench opening 115O. The polysilicon layer pattern 124, the oxide layer pattern 122 or the nitride layer pattern 126 may be in the form of liners on the bottom surface 115B or the side surface 115S of the trench 115. To put it another way, the polysilicon layer pattern 124, the oxide layer pattern 122 or the nitride layer pattern 126 may extend from the bottom surface 115B to the side surface 115S of the trench 115. To put it yet another way, conformal layers 122, 124 and 126 may be provided. It will be understood that the conformal layer need not conform to the surface of the underlying layer or region along the entire surface thereof, but, rather, includes opposing surfaces that both conform to the contour of the underlying layer or region over at least a portion thereof.

The polysilicon layer pattern 124 may be doped with oxygen. Alternatively, the polysilicon layer pattern 124 may be doped with carbon. Alternatively, the polysilicon layer pattern 124 may be doped with nitrogen. Combinations and subcombinations of these and/or other dopants may be provided.

The oxide layer pattern 122 may comprise, for example, a silicon oxide layer (SiO$_2$), but is not limited thereto. The nitride layer pattern 126 may comprise, for example, a silicon nitride layer (Si$_3$N$_4$), but is not limited thereto. The insulation layer pattern 128 may comprise an insulation layer having excellent gap-fill characteristics and may comprise, for example, a spin-on-glass (SOG)-based tonen silazene (TOSZ), but is not limited thereto.

A semiconductor device having an extended structure of the embodiment of FIG. 1 may be a transistor semiconductor device that further includes a gate electrode structure on the active region 130 of the semiconductor substrate 110 defined by the device isolation pattern 120. The gate structure may be, for example, a gate electrode structure 140 illustrated in FIG. 20, a gate electrode structure 140 illustrated in FIG. 24, a gate electrode structure 140 illustrated in FIG. 25, and a gate electrode structure 165 illustrated in FIG. 26.

When the gate electrode structure is a portion of, particularly, a p-type metal oxide semiconductor field effect transistor (PMOSFET), electrons are trapped in a portion of the device isolation pattern 120, and holes are charged in a portion of the device isolation pattern 120 opposite to the portion where the electrons are trapped.

Figure 2:
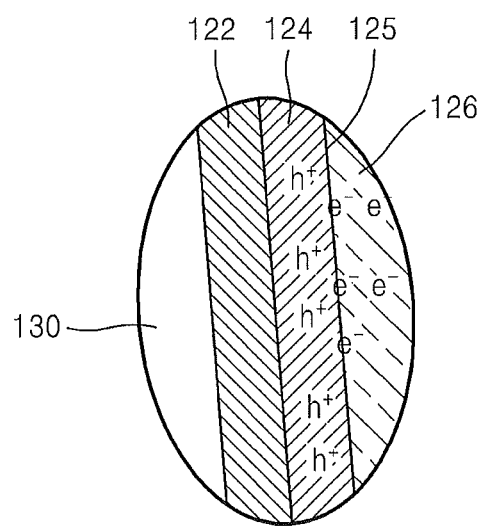
FIG. 2 is a cross-sectional view illustrating holes and electrons being charged in a portion A of the semiconductor device of FIG. 1.

FIG. 2 is a cross-sectional view illustrating holes and electrons being charged in a portion A of the semiconductor device of FIG. 1.

As the size of the semiconductor devices is reduced, an electric field between channels may rapidly increase, thereby generating a large number of hot electrons. In particular, in a PMOS transistor, holes, which are carriers, collide with a lattice of a drain region to which a high electric field is applied, and thus electron-hole pairs are generated, thereby generating a large number of hot electrons.

The hot electrons penetrate into the device isolation pattern 120 and thus are confined in the nitride layer pattern 126. That is, as the nitride layer pattern 126 is disposed between the oxide layer pattern 122 and the insulation layer pattern 128, a potential difference is created in the nitride layer pattern 126, and thus electrons (e−) are confined in the nitride layer pattern 126.

Meanwhile, the electrons (e−) that are confined due to the potential difference are trapped not only in the nitride layer pattern 126 but also in an interface 125 between the polysilicon layer pattern 124 and the nitride layer pattern 126. In detail, the electrons (e−) may be trapped in lattice defects of the nitride layer pattern 126 and/or defects existing in the interface 125 between the polysilicon layer pattern 124 and the nitride layer pattern 126.

Meanwhile, the trapped electrons (e−) pull the holes (h+) having charges of the opposite type, and thus the holes (h+) are charged mainly in an inner portion of the polysilicon layer pattern 124. That is, due to the polysilicon layer pattern 124, the amount of holes (h+) in the active region 130 of the semiconductor substrate 110 is reduced. Accordingly, even when the electrons (e−) are trapped in the device isolation pattern 120, the holes (h+) are not concentrated in the active region 130 of the semiconductor substrate 110 adjacent to the device isolation pattern 120.

Since the holes (h+) are not concentrated in the active region 130 of the semiconductor substrate 110 adjacent to the device isolation pattern 120, an effective length of a channel formed in the active region 130 may not vary and thus an abnormal operation of the semiconductor device may be reduced or prevented.

Accordingly, FIGS. 1 and 2 also illustrate a semiconductor device according to various embodiments described herein, wherein a semiconductor substrate 110 includes a trench 115 therein. A first conformal layer 124 is provided on a surface 115B, 115S of the trench 115 and a second conformal layer 126 is provided on the first conformal layer 124 and remote from the surface 115B, 115S of the trench 115. The second conformal layer 126 is configured to trap carriers of a first conductivity type, such as electrons, therein, that pull carriers of a second conductivity type, such as holes, from the semiconductor substrate 130 adjacent the surface 115B, 115S of the trench 115 into the first conformal layer 124. The first conformal layer 124 may comprise polysilicon and the second conformal layer 126 may comprise nitride. An active semiconductor device may be provided in the semiconductor substrate 130 adjacent the trench 115.

Figure 3:
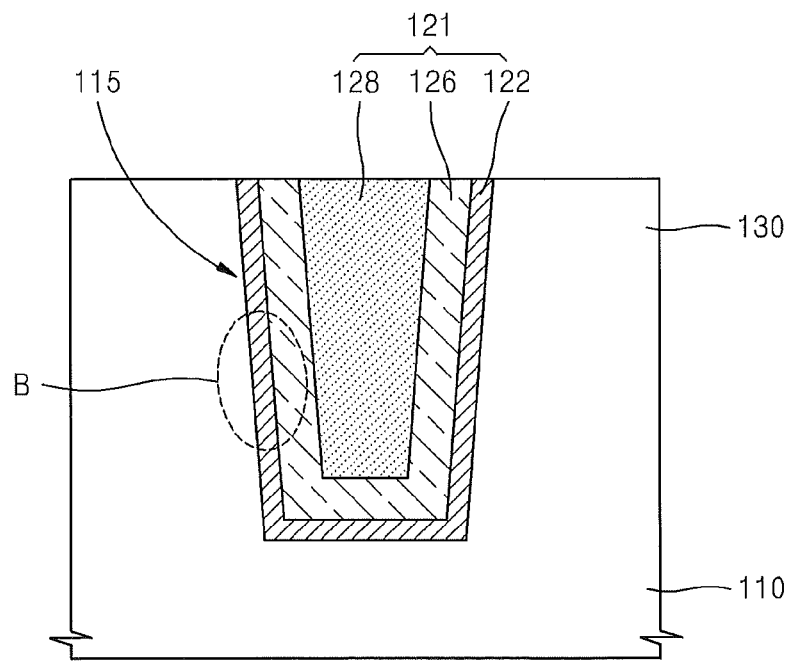
FIG. 3 is a cross-sectional view illustrating a semiconductor device according to a comparative example in comparison with the semiconductor device of FIG. 1.

FIG. 3 is a cross-sectional view illustrating a semiconductor device according to a comparative example in comparison with the semiconductor device of FIG. 1. In FIG. 3, like reference numerals as those in FIG. 1 denote like elements, and thus, description of the same components as described with reference to FIG. 1 above will be omitted.

Referring to FIG. 3, a device isolation pattern 121 includes an oxide layer pattern 122 on a surface of a trench 115, a nitride layer pattern 126 on the oxide layer pattern 122, and an insulation layer pattern 128 on the nitride layer pattern 126. The insulation layer pattern 128 may fill the trench 115. That is, in the comparative example illustrated in FIG. 3, unlike FIG. 1, the polysilicon layer pattern 124 is not present.

A semiconductor device having an extended structure of the comparative example of FIG. 3 may be a transistor semiconductor device that further includes a gate electrode structure formed on an active region of a semiconductor substrate 110 defined by the device isolation pattern 121.

When the gate electrode structure is a portion of, particularly, a PMOSFET, electrons are trapped in a portion of the device isolation pattern 121 and holes are charged in a portion of the device isolation pattern 121 opposite to the portion where the electrons are trapped.

Figure 4:
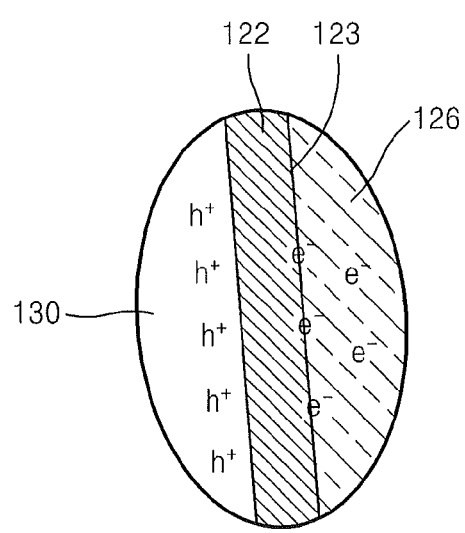
FIG. 4 is a cross-sectional view illustrating holes and electrons being charged in a portion B of the semiconductor device FIG. 3.

FIG. 4 is a cross-sectional view illustrating holes and electrons being charged in a portion B of the semiconductor device of FIG. 3.

As the size of semiconductor devices is reduced, an electric field between channels may rapidly increase, thereby generating a large number of hot electrons. The hot electrons penetrate into the device isolation pattern 121 and thus are confined in the nitride layer pattern 126. That is, as the nitride layer pattern 126 is disposed between the oxide layer pattern 122 and the insulation layer pattern 128, a potential difference is created in the nitride layer pattern 126, and thus electrons (e−) are confined in the nitride layer pattern 126.

Meanwhile, the electrons (e−) that are confined due to the potential difference are trapped not only in the nitride layer pattern 126 but also in an interface 123 between the oxide layer pattern 122 and the nitride layer pattern 126. In detail, the electrons (e−) are trapped in lattice defects of the nitride layer pattern 126 and/or defects existing in the interface 123 between the oxide layer pattern 122 and the nitride layer pattern 126.

Meanwhile, the trapped electrons (e−) pull the holes (h+) having charges of the opposite type by electric attraction, and the holes (h+) are concentrated mainly in the active region of the semiconductor substrate 110 that is adjacent to the device isolation pattern 121.

When the holes h(+) are concentrated in the active region 130 adjacent to the device isolation pattern 121, effective channel length is reduced, and thus a current flows while no voltage is applied to a gate, and a threshold voltage is reduced and a leakage current is increased, consequently causing deterioration of the semiconductor device. Such a phenomenon is called a hot electron induced punch through (HEIP). The HEIP may not be of great significance in an n-type MOSFET but in a p-type MOSFET where holes are the main carriers and a high voltage Vpp is applied, the HEIP may be particularly problematic.

However, as described above, as the polysilicon layer pattern 124 is provided in the semiconductor device as illustrated in FIG. 2, holes (h+) are not concentrated in the active region 130 of the semiconductor substrate 110, and accordingly, the HEIP may be reduced or prevented.

Figure 5:
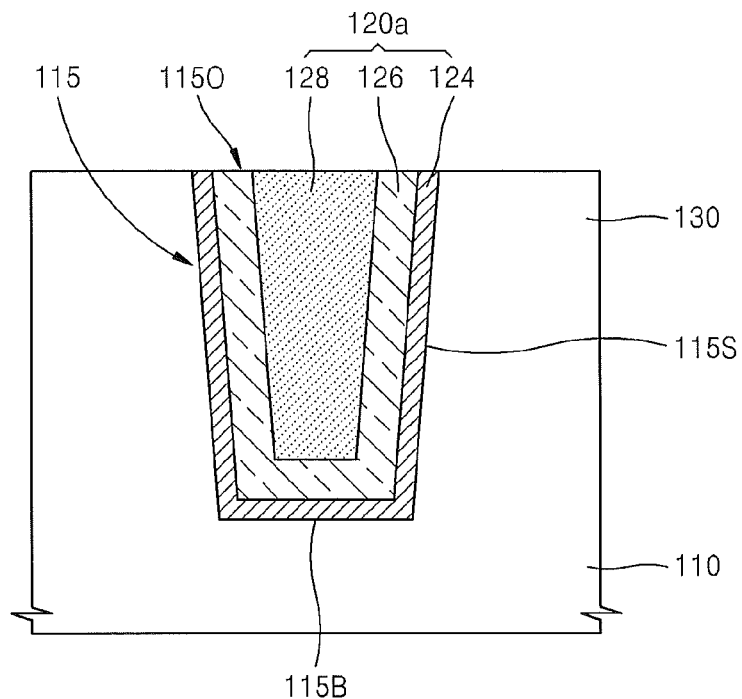
FIG. 5 is a cross-sectional view illustrating another semiconductor device according to various embodiments described herein.

FIG. 5 is a cross-sectional view illustrating another semiconductor device according to various embodiments described herein. In FIG. 5, like reference numerals as those in FIG. 1 denote like elements, and thus, description of the same components as described with reference to FIG. 1 above will be omitted.

Referring to FIG. 5, the semiconductor device includes a semiconductor substrate 110 including a trench 115 therein and a device isolation pattern 120a in the trench 115. The device isolation pattern 120a corresponds to a device isolation region of a semiconductor device, and a portion 130 of the semiconductor substrate 110 defined between the device isolation pattern 120a and another, adjacent device isolation pattern 120a corresponds to an active region of the semiconductor device.

The device isolation pattern 120a may have, for example, a shallow trench isolation (STI) structure having a small width and excellent device isolation characteristics at the same time.

The device isolation pattern 120a includes a polysilicon layer pattern 124 on a surface of the trench 115, a nitride layer pattern 126 on the polysilicon layer pattern 124 remote from the surface of the trench, and an insulation layer pattern 128 on the nitride layer pattern 126, remote from the polysilicon layer pattern. The insulation layer pattern 128 may fill the trench 115.

The polysilicon layer pattern 124 may be doped with oxygen. Alternatively, the polysilicon layer pattern 124 may be doped with carbon. Alternatively, the polysilicon layer pattern 124 may be doped with nitrogen. Combinations and subcombinations of these and/or other dopants may be provided.

The semiconductor device of FIG. 5 is different from that of FIG. 1 in that the oxide layer pattern 122 is not interposed between the polysilicon layer pattern 124 and the surface of the trench 115 in the device isolation pattern 120a.

It has been found that HEIP was also prevented due to the polysilicon layer pattern 124 doped with oxygen, carbon or nitrogen in the semiconductor device having the device isolation pattern 120a illustrated in FIG. 5.

Figure 6:
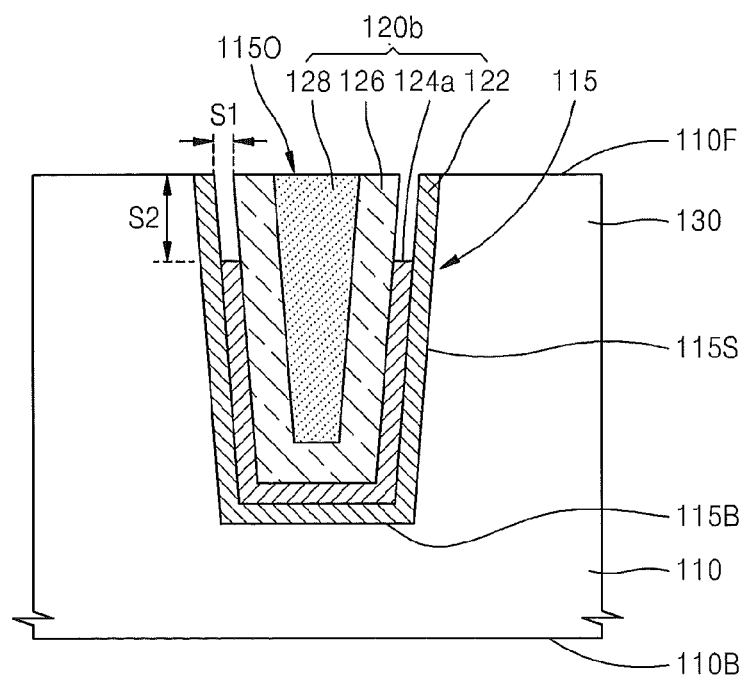
FIG. 6 is a cross-sectional view illustrating yet another semiconductor device according to various embodiments described herein.

FIG. 6 is a cross-sectional view illustrating another semiconductor device according to various embodiments described herein. In FIG. 6, like reference numerals as those in FIG. 1 denote like elements, and thus, description of the same components as described with reference to FIG. 1 above will be omitted.

Referring to FIG. 6, the semiconductor device includes a semiconductor substrate 110 including a trench 115 and a device isolation pattern 120b in the trench 115. The device isolation pattern 120b corresponds to a device isolation region of a semiconductor device, and a portion 130 of the semiconductor substrate 110 defined between one device isolation pattern 120b and another, adjacent device isolation pattern 120b corresponds to an active region of a semiconductor device.

The device isolation pattern 120b may have, for example, a shallow trench isolation (STI) structure which has a small width and excellent device isolation characteristics at the same time.

The device isolation pattern 120b includes an oxide layer pattern 122 on a surface of the trench 115, a polysilicon layer pattern 124a on the oxide layer pattern 122, a nitride layer pattern 126 on the polysilicon layer pattern 124a, and an insulation layer pattern 128 on the nitride layer pattern 126. The insulation layer pattern 128 may fill the trench 115.

The polysilicon layer pattern 124a may be doped with oxygen. Alternatively, the polysilicon layer pattern 124a may be doped with carbon. Alternatively, the polysilicon layer pattern 124a may be doped with nitrogen. Combinations and subcombinations of these and/or other dopants may be provided.

The trench 115 may include a bottom surface 115B and a side surface 115S. The polysilicon layer pattern 124a, the oxide layer pattern 122 or the nitride layer pattern 126 may extend from the bottom surface 115B to the side surface 115S of the trench 115.

However, while the polysilicon layer pattern 124a is extended from the bottom surface 115B of the trench 115 to the side surface 115S so as to be formed on the side surface of the trench 115, the polysilicon layer pattern 124a is extended not up to an upper surface 110F of the semiconductor substrate 110 and is thus spaced apart from the upper surface 110F. The upper surface 110F of the semiconductor substrate 110 may correspond to an upper surface of the active region 130, but is not limited thereto. Stated succinctly, the polysilicon layer pattern 124a on the side surface 115S of the trench 115 is recessed from the trench opening 115O.

In general, while the oxide layer pattern 122, the nitride layer pattern 126, and the insulation layer pattern 128 have insulating characteristics, the polysilicon layer pattern 124a may be doped with oxygen, carbon, nitrogen and/or other dopants to have semiconductor characteristics. Meanwhile, a conductive structure such as a pad electrode connected to a capacitor, a pad electrode connected to a bit line, a gate electrode, a source region, a drain region, or the like, may be formed on the active region 130 of the semiconductor substrate 110.

Accordingly, when two ends of the polysilicon layer pattern 124a are exposed through the upper surface 110F of the semiconductor substrate 110, that is, when the two ends of the polysilicon layer pattern 124a are at the same level as the upper surface 110F of the semiconductor substrate 110, the polysilicon layer pattern 124a and the conductive structure may contact each other due to misalignment and may deteriorate operating characteristics of the semiconductor device.

In order to reduce or prevent this contact, the two ends of the polysilicon layer pattern 124a are recessed to have a lower level than the upper surface 110F of the semiconductor substrate 110 such that the polysilicon layer pattern 124a is extended not up to the upper surface 110F of the semiconductor substrate 110 and is thus spaced apart from the upper surface 110F. A distance between the upper surface 110F of the semiconductor substrate 110 and the two ends of the polysilicon layer pattern 124a corresponds to a predetermined depth S2 from the upper surface 110F of the semiconductor substrate 110. It will be understood that unequal recess depths also may be provided.

If the depth S2 is too small, device deterioration may be generated due to misalignment, and if the depth S2 is too deep, device defects may be generated due to the HEIP. Thus, the depth S2 may be adjusted in consideration of the characteristics of the device.

For example, when a thickness S1 of the polysilicon layer pattern 124a is about 5 nm, the depth S2 may be about 30 nm.

A space between the two ends of the polysilicon layer pattern 124a and the upper surface 110F of the semiconductor substrate 110 may be a closed space filled by air after undergoing a subsequent process or may be filled with an insulating material such as an interlayer insulation layer that is applied in a subsequent process.

It has been found that HEIP was also reduced or prevented due to the polysilicon layer pattern 124a doped with oxygen, carbon or nitrogen in the semiconductor device having the device isolation pattern 120b illustrated in FIG. 6.

Figure 7:
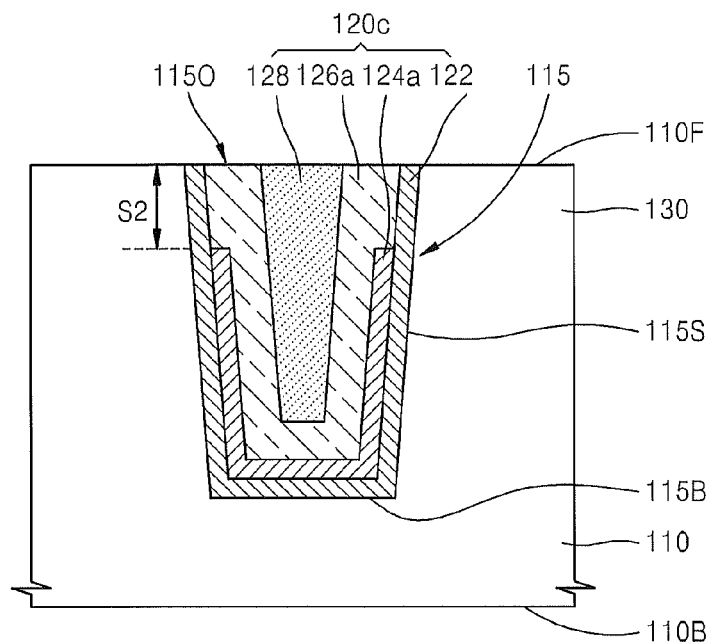
FIG. 7 is a cross-sectional view illustrating still another semiconductor device according to various embodiments described herein.

FIG. 7 is a cross-sectional view illustrating another semiconductor device according to various embodiments described herein. In FIG. 7, like reference numerals as those in FIG. 1 denote like elements, and thus, description of the same components as described with reference to FIG. 1 above will be omitted.

Referring to FIG. 7, the semiconductor device includes a semiconductor substrate 110 including a trench 115 therein and a device isolation pattern 120c in the trench 115.

The device isolation pattern 120c includes an oxide layer pattern 122 on a surface of the trench 115, a polysilicon layer pattern 124a on the oxide layer pattern 122, a nitride layer pattern 126a on the polysilicon layer pattern 124a, and an insulation layer pattern 128 on the nitride layer pattern 126a. The insulation layer pattern 128 may fill the trench 115.

Two ends of the polysilicon layer pattern 124a are extended from a bottom surface 115B to a side surface 115S of the trench 115 but is extended not up to an upper surface 110F of the semiconductor substrate 110 and is thus spaced apart from the upper surface 110F. Stated succinctly, they are recessed from the trench opening 115O.

However, in FIG. 7, unlike in FIG. 6, the nitride layer pattern 126a is filled between the two ends of the polysilicon layer pattern 124a and the upper surface 110F of the substrate 110.

It has been found that HEIP was also reduced or prevented due to the polysilicon layer pattern 124a doped with oxygen, carbon or nitrogen in the semiconductor device having the device isolation pattern 120c illustrated in FIG. 7.

Methods of manufacturing semiconductor devices according to various embodiments described herein will be described below.

FIGS. 8 through 14 are cross-sectional views illustrating methods of manufacturing semiconductor devices of FIG. 1, according to various embodiments described herein.

Figure 8:
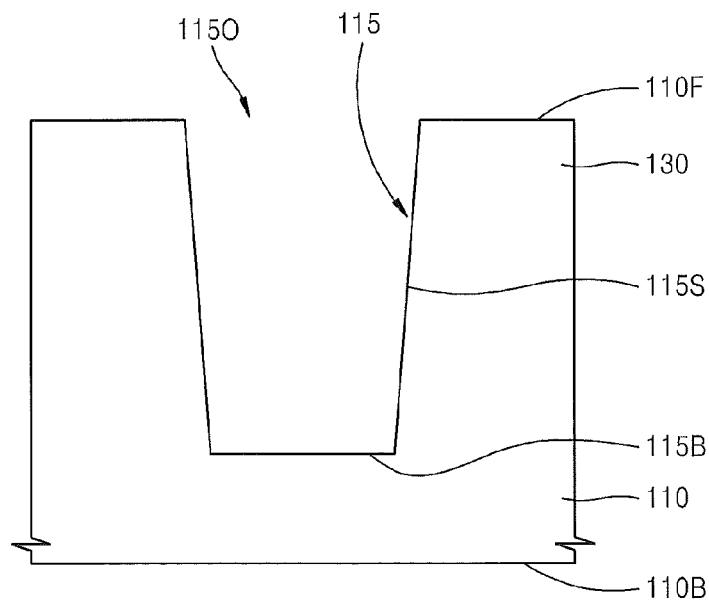
FIGS. 8 through 19 are cross-sectional views illustrating methods of manufacturing semiconductor devices according to various embodiments described herein.

First, referring to FIG. 8, a trench 115 is formed in a semiconductor substrate 110. Inner walls of the trench 115 may include a bottom surface 115B and a side surface 115S. A trench opening 115O is also provided.

Figure 9:
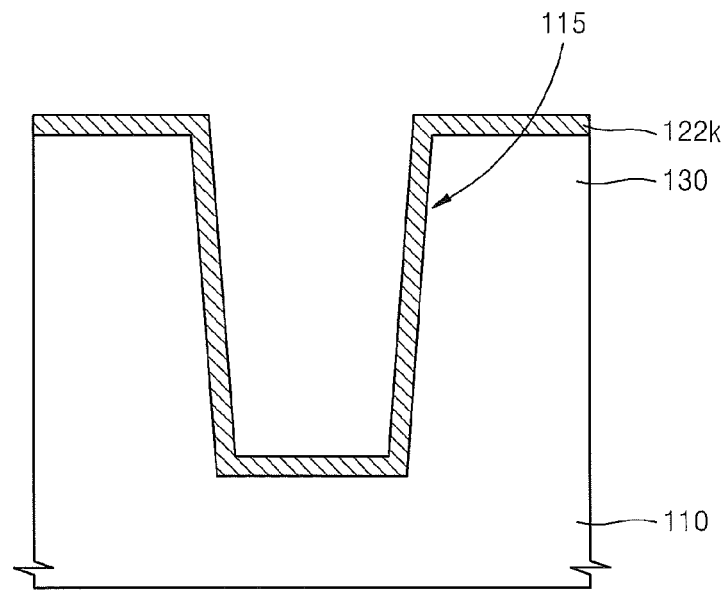

Referring to FIG. 9, an oxide layer 122k is formed on the semiconductor substrate 110 including the trench 115. The oxide layer 122k may be formed of, for example, a silicon oxide layer ($SiO_2$), but is not limited thereto.

The oxide layer 122k may be formed, for example, using a silane-based gas such as $SiH_4$, $Si_2Cl_2H_2$, $SiH_6$, $Si_2H_6$, $Si_3H_8$ or a mixed gas of these, or a gas such as $O_2$, $N_2$, Ar, He or a mixed gas of these.

Figure 10:
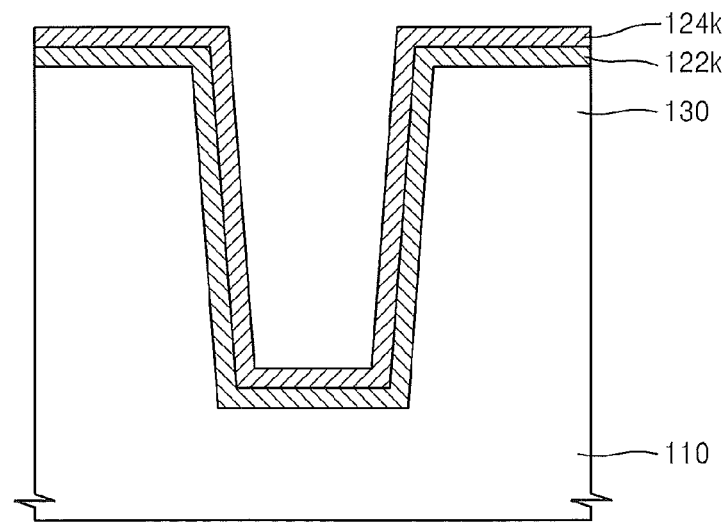

Referring to FIG. 10, a polysilicon layer 124k is formed on the oxide layer 122k. The polysilicon layer 124k may be doped with oxygen, carbon, nitrogen and/or other dopants.

The polysilicon layer 124k doped with oxygen, carbon, nitrogen and/or other dopants may be formed using a chemical vapor deposition (CVD) process using a precursor including oxygen, carbon, nitrogen and/or other dopants.

Alternatively, the polysilicon layer 124k doped with oxygen, carbon, nitrogen and/or other dopants may be formed using an epitaxial growth process using a precursor including oxygen, carbon, nitrogen and/or other dopants.

For example, a polysilicon layer 124k doped with oxygen may be formed of a polysilicon layer doped with oxygen using a CVD process or an epitaxial growth process using a precursor including $N_2O$ and $Si_2H_6$ or a precursor including $SiH_4$ and $N_2O$.

For example, a polysilicon layer 124k doped with carbon may be formed of a polysilicon layer doped with carbon using a CVD process or an epitaxial growth process using a precursor including $SiH_3CH_3$ and $Si_2H_6$ (or $SiH_2Cl_2$) or a precursor including $SiH_4$ and $C_2H_4$ (or $SiH_3CH_3$).

For example, a polysilicon layer 124k doped with nitrogen may be formed of a polysilicon layer doped with nitrogen using a CVD process or an epitaxial growth process using a precursor including $NH_3$ and $Si_2H_6$ or a precursor including $SiH_4$ and $NH_3$.

Alternatively, the polysilicon layer 124k doped with oxygen may be formed by forming a polysilicon layer and doping the polysilicon layer with oxygen using $N_2O$ and/or NO gas. The doping operation may be performed after the forming a polysilicon layer. Alternatively, the doping operation and the forming a polysilicon layer may be performed at the same time.

Figure 11:
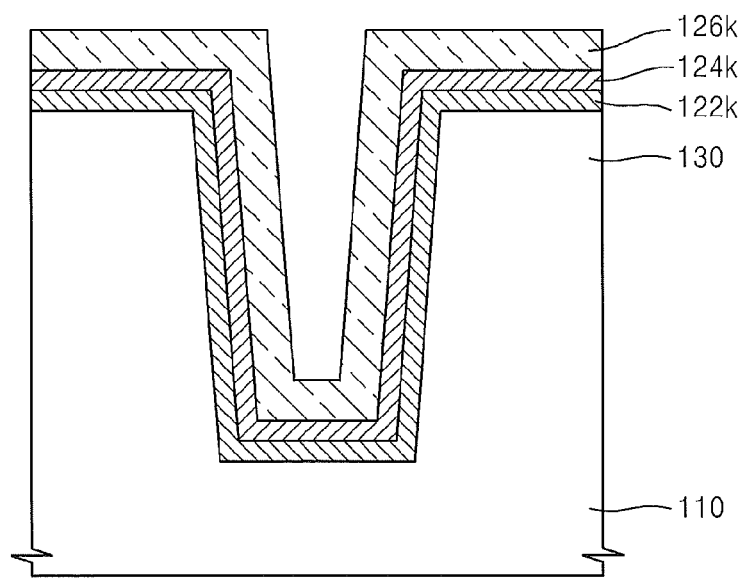

Referring to FIG. 11, a nitride layer 126k is formed on the polysilicon layer 124k. The nitride layer 126k may be formed of, for example, a silicon nitride layer ($Si_3N_4$), but is not limited thereto.

The nitride layer 126k may be formed, for example, using a plasma enhanced CVD (PECVD) method or a radical nitriding method, under a pressure in the range from 0.01 to 10 Torr, and by using a nitrogen-based reaction gas such as $N_2$, NO, $N_2O$ and/or $NH_3$, or by using a mixed gas comprising at least one of the nitrogen-based gases and at least one source gas selected from $SiH_4$, $Si_2Cl_2H_2$, $SiH_6$, $Si_2H_6$ and/or $Si_3H_8$. Also, the nitride layer 126k may be formed under an atmosphere of Ar, He and/or the like. However, these conditions are examples and are not limited thereto.

Figure 12:
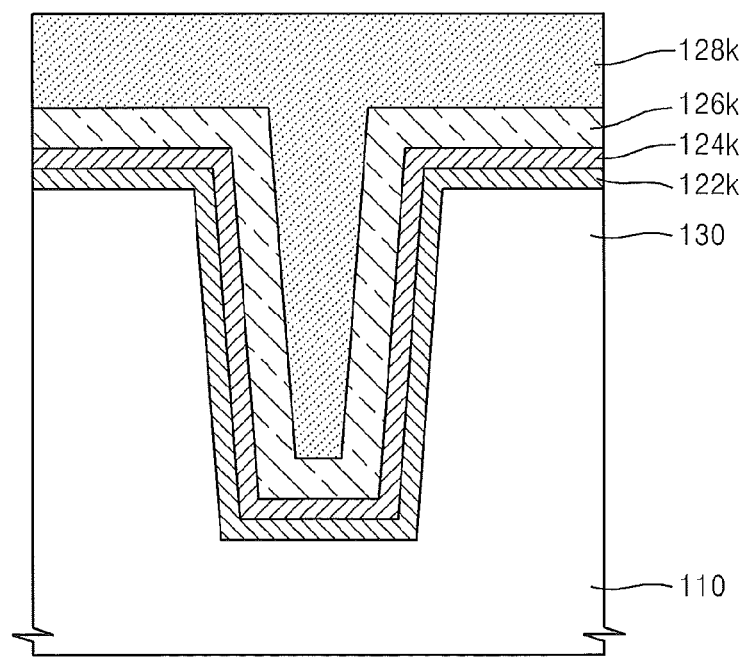

Referring to FIG. 12, an insulation layer 128k is formed on the nitride layer 126k. The insulation layer 128k may be formed of an insulation layer having excellent gap-fill characteristics, and may be formed of a SOG-based TOSZ, but is not limited thereto.

The insulation layer 128k may be formed using a high density plasma CVD (HDP-CVD) method, an atmosphere pressure CVD (O3-TEOS APCVD) method, an O3-TEOS Sub-APCVD method, an atomic layer CVD (ALCVD) method and/or a molecular layer CVD (MLCVD) method.

Figure 13:
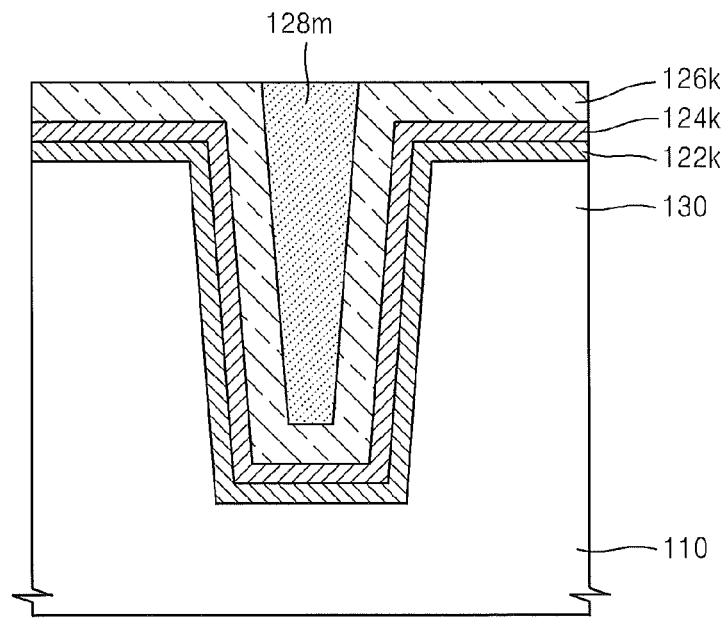

Referring to FIG. 13, a portion of the insulation layer 128k is removed by planarizing until the nitride layer 126k is exposed, thereby forming an insulation layer pattern 128m. The removing operation by planarizing may be performed by using, for example, a chemical mechanical polishing (CMP) process and/or an etch-back process.

Figure 14:
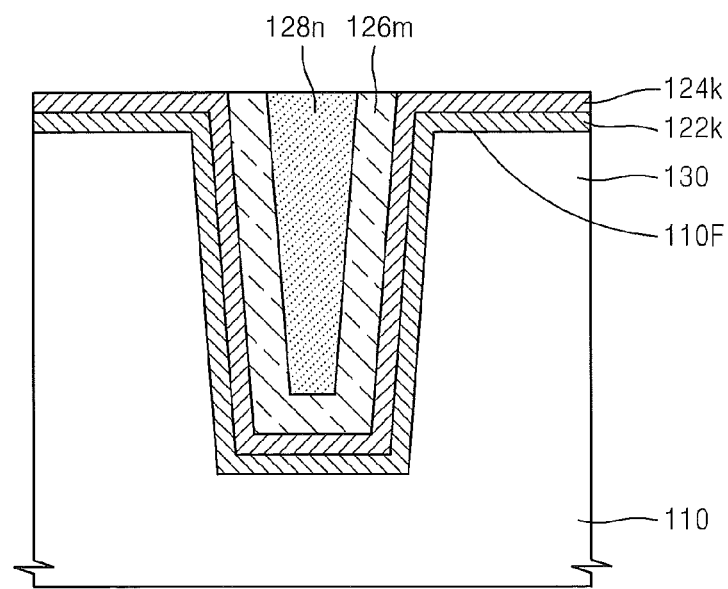

Referring to FIG. 14, portions of the insulation layer pattern 128m and the nitride layer 126k are removed by planarizing until the polysilicon layer 124k is exposed such that an insulation layer pattern 128n, the nitride layer pattern 126a, and the polysilicon layer 124k have the same level.

In addition, portions of the insulation layer pattern 128m, the nitride layer pattern 126m, the polysilicon layer 124k, and the oxide layer 122k are removed by planarizing until the upper surface 110F of the semiconductor substrate 110 is exposed, thereby completing the semiconductor device illustrated in FIG. 1.

The removing operation by planarizing may be performed by using, for example, a CMP process and/or an etch-back process, and may be performed in discrete operations or in one continuous operation.

FIGS. 8 through 15 are cross-sectional views illustrating methods of manufacturing semiconductor devices of FIG. 6. FIGS. 8 through 13 have been described above, and thus description thereof will not be repeated here.

Referring to FIG. 14, portions of the insulation layer pattern 128m and the nitride layer 126k are removed by planarizing until the polysilicon layer 124k is exposed such that the insulation layer 128n, the nitride layer pattern 126a, and the polysilicon layer 124k have the same level.

Figure 15:
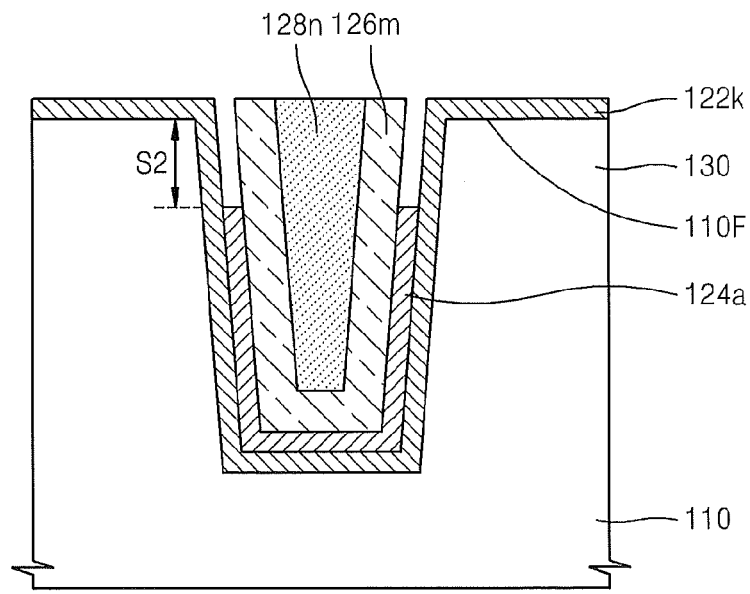

Further, referring to FIG. 15, only a portion of the polysilicon layer 124k is selectively etched using an etching selectivity of the insulation layer pattern 128n, the nitride layer pattern 126a, and the oxide layer 122k with respect to the polysilicon layer 124k. The polysilicon layer 124k may be etched such that a portion of the polysilicon layer 124k formed on the side surface of the trench 115 is removed up to a predetermined depth S2.

The polysilicon layer 124k may be etched by using, for example, an etch-back process, and adjustment of an amount of the polysilicon layer 124k removed by using the etch-back process up to the predetermined depth S2 may be performed.

Further, portions of the insulation layer pattern 128n, the nitride layer pattern 126m, and the oxide layer 122k are removed by planarizing until the upper surface 110F of the semiconductor device 110 is exposed, thereby completing the semiconductor device illustrated in FIG. 6.

The removing operation by planarizing may be performed by using, for example, a CMP process or an etch-back process, and may be performed in discrete operations or in one continuous operation.

FIGS. 8 through 10 and FIGS. 16 through 19 are cross-sectional views illustrating methods of manufacturing semiconductor devices of FIG. 7. FIGS. 8 through 10 have been described above, and thus description thereof will not be repeated here.

Figure 16:
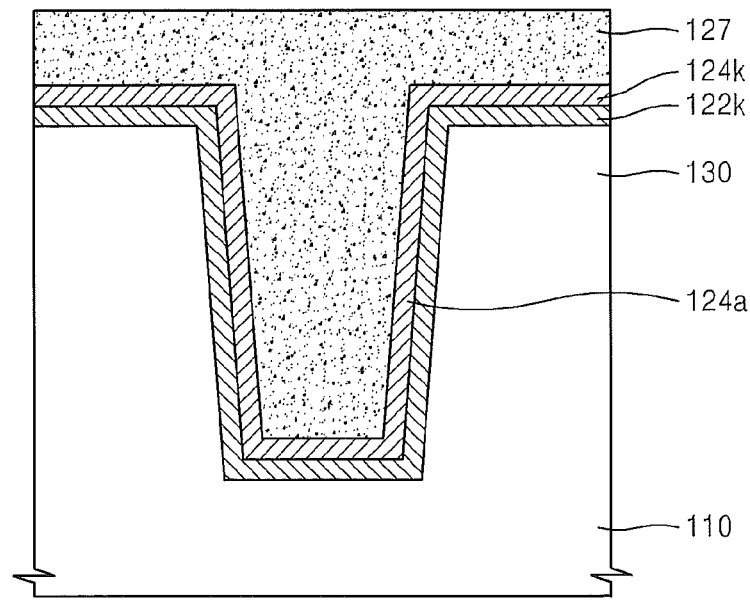

Referring to FIG. 16, a sacrificial layer 127 is formed on the polysilicon layer 124k. The sacrificial layer 127 may be formed to completely fill the trench 115. The sacrificial layer 127 may comprise a carbon-containing layer such as an amorphous carbon layer (ACL) and/or a spin on hard mask (SOH).

Figure 17:
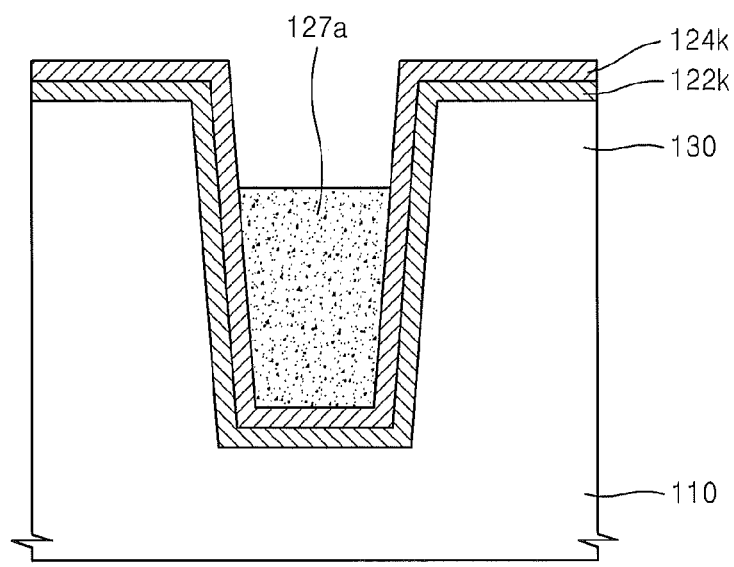

Referring to FIG. 17, a portion of the sacrificial layer 127 is removed by planarizing to form a sacrificial layer pattern 127a. A level of an upper surface of the sacrificial layer pattern 127a is the same as a level of two ends of a polysilicon layer pattern 124a that is to be formed in a subsequent process, and thus the level of the upper surface of the sacrificial layer pattern 127a may be adjusted to be disposed in the trench 115. The removing operation by planarizing may be performed by using, for example, a CMP process and/or an etch-back process.

Figure 18:
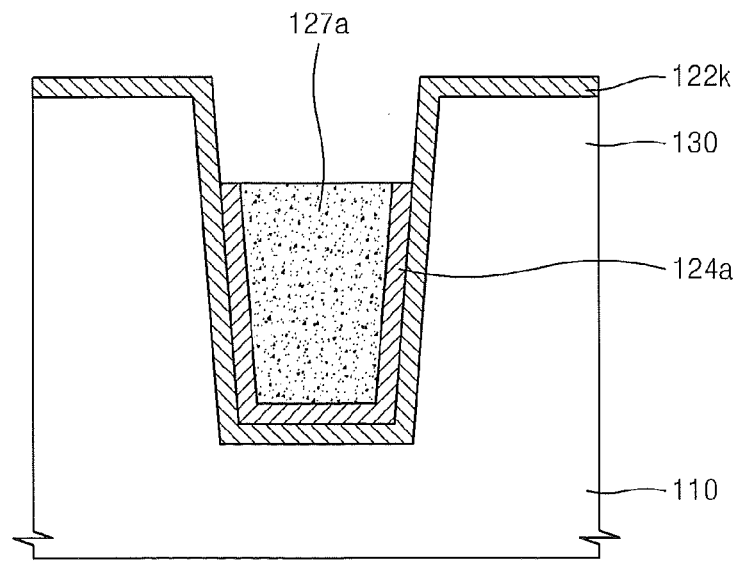

Referring to FIG. 18, a portion of the polysilicon layer 124k is etched to form a polysilicon layer pattern 124a. The polysilicon layer 124k has an etching selectivity with respect to the sacrificial layer pattern 127a, and thus the polysilicon layer 124k is etched until it has the same level as the upper surface of the sacrificial layer pattern 127a. Accordingly, the two ends of the polysilicon layer pattern 124a have the same level as the upper surface of the sacrificial layer pattern 127a.

Figure 19:
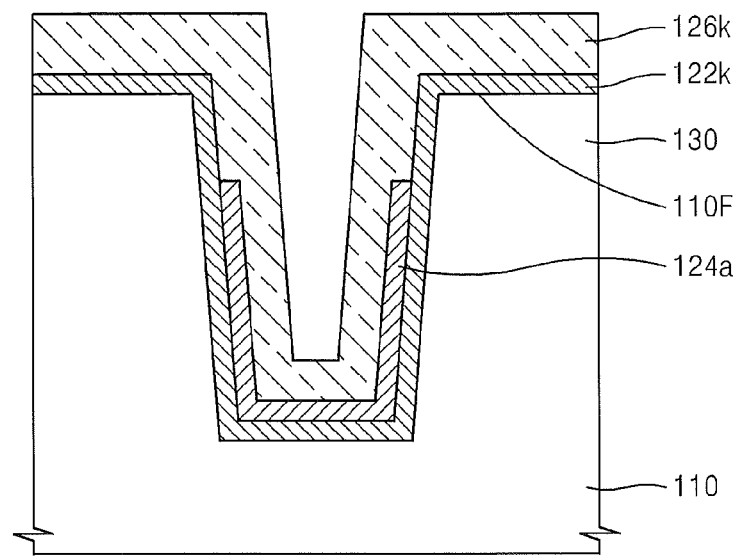

Referring to FIG. 19, the sacrificial layer pattern 127a is removed. An operation of removing the sacrificial layer pattern 127a may include an aching operation and/or a stripping operation. After removing the sacrificial layer pattern 127a, a nitride layer pattern 126k is formed on the polysilicon layer pattern 124a and the oxide layer 122k.

Further, an insulation layer (not shown) is formed to fill the trench, and portions of the insulation layer (not shown), the nitride layer 126k, and the oxide layer 122k are removed by planarizing until the upper surface 110F of the semiconductor substrate 110 is exposed, thereby completing the semiconductor device illustrated in FIG. 7. The removing operation by planarizing may be performed by using, for example, a CMP process and/or an etch-back process.

When forming the semiconductor device illustrated in FIG. 7 by using the method illustrated in FIGS. 8 through 10 and FIGS. 16 through 19, to adjust an amount of a portion of the polysilicon layer that is removed from a space from the upper surface 110F of the semiconductor device 110 up to the predetermined depth S2 may be relatively easier than when forming the semiconductor device of FIG. 6 using the method illustrated in FIGS. 8 through 15.

Figure 20:
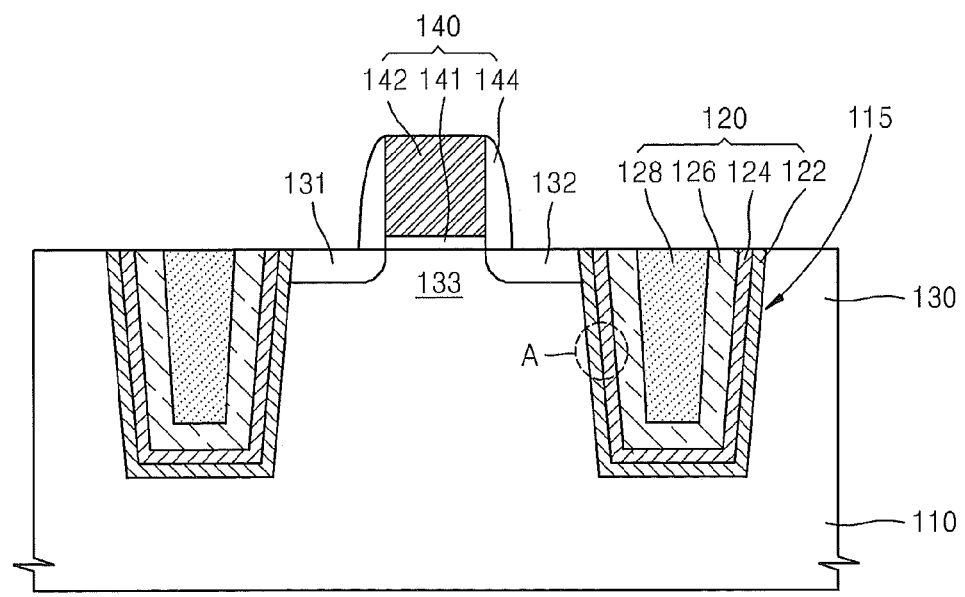
FIG. 20 is a cross-sectional view illustrating another semiconductor device according to various embodiments described herein.
Figure 21:
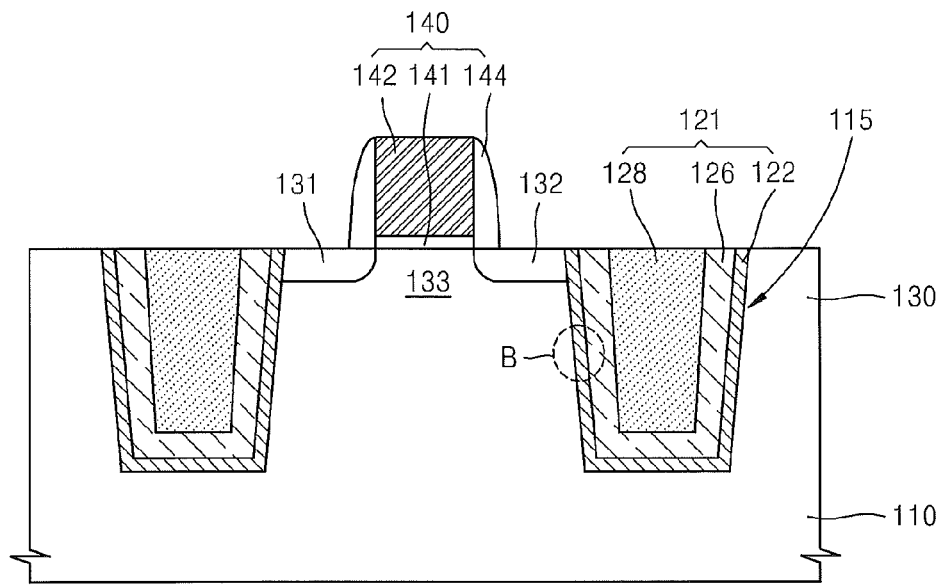
FIG. 21 is a cross-sectional view illustrating a semiconductor device according to a comparative example in comparison with the semiconductor device of FIG. 20.

FIG. 20 is a cross-sectional view illustrating another semiconductor device according to various embodiments described herein, and FIG. 21 is a cross-sectional view illustrating a semiconductor device according to a comparative example in comparison with the semiconductor device of FIG. 20.

Referring to FIG. 20, a semiconductor substrate 110 including a trench 115 therein is provided. A device isolation pattern 120 is provided in the trench 115. The device isolation pattern 120 has been described above in detail with respect to FIG. 1, and thus description thereof will not be repeated here.

The semiconductor substrate 110 that is defined by the device isolation pattern 120 forms an active region 130. The active region 130 includes a source region 131, a drain region 132, and a channel region 133.

A gate electrode structure 140 is provided on the semiconductor substrate 110, for example, on the active region 130. The gate electrode structure 140 includes a gate insulation layer 141 on the semiconductor substrate 110 and a gate electrode 142 on the gate insulation layer 141. A spacer layer pattern 144 that protects the gate insulation layer 141 and the gate electrode 142 may be further provided on side surfaces of the gate insulation layer 141 and the gate electrode 142.

In a portion A, holes and electrons may be charged, and since this has been described above with respect to FIG. 2, description thereof will be omitted.

Referring to FIG. 21, a semiconductor substrate 110 including a trench 115 therein is provided. A device isolation pattern 121 is provided in the trench 115. The device isolation pattern 121 has been described above in detail with respect to FIG. 3, and thus description thereof will be omitted.

In a portion B, holes and electrons may be charged, and since this has been described above with respect to FIG. 4, description thereof will be omitted.

While a polysilicon layer pattern 124 doped with oxygen, carbon, and nitrogen is interposed between the trench 115 and the nitride layer pattern 126 in the device isolation pattern 120 of FIG. 20, in the device isolation pattern 121 of FIG. 21, the polysilicon layer pattern 124 doped with oxygen, carbon or nitrogen is not interposed between the trench 115 and the nitride layer pattern 126.

It has been found that HEIP in a semiconductor device varies according to whether the polysilicon layer pattern 124 doped with oxygen, carbon or nitrogen is provided therein or not, in combination with the other layers described herein.

Figure 22:
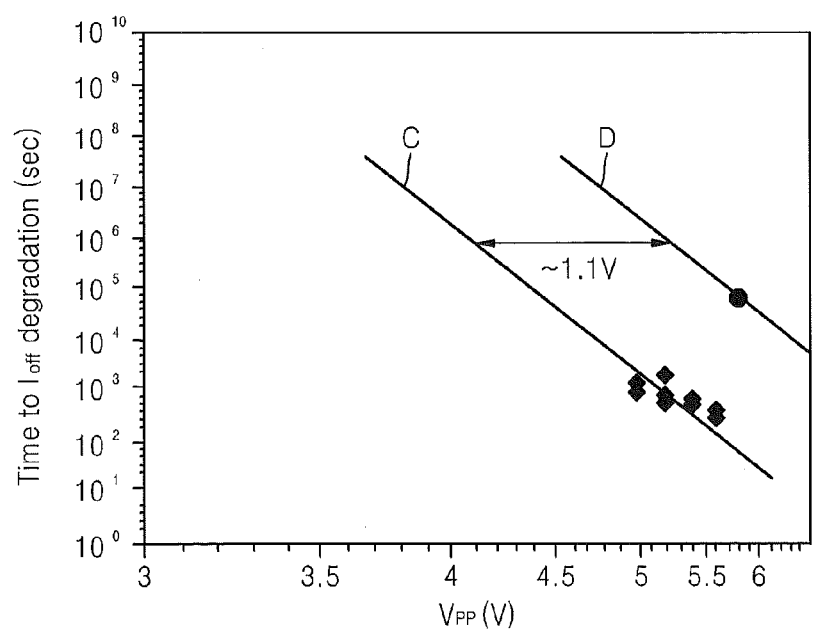
FIG. 22 is a graph of HEIP characteristics of the semiconductor devices illustrated in FIGS. 20 and 21.

FIG. 22 is a graph of HEIP characteristics of the semiconductor devices illustrated in FIGS. 20 and 21.

Referring to FIG. 22, in a semiconductor device D of FIG. 20 in which the polysilicon layer pattern 124 doped with oxygen, carbon or nitrogen is provided, a length of a time until deterioration of an off current Ioff is reached stays the same even when a boost voltage Vpp is about 1.1 V higher than that of a semiconductor device C in which the polysilicon layer pattern 124 doped with oxygen, carbon or nitrogen is not provided. This indicates that HEIP is reduced or prevented in the semiconductor device D of FIG. 20 in which the polysilicon layer pattern 124 doped with oxygen, carbon or nitrogen is provided.

Meanwhile, the device isolation pattern 120 illustrated in FIG. 1 is used as a device isolation pattern of the semiconductor device of FIG. 20, but is not limited thereto. For example, the device isolation pattern of FIG. 20 may be replaced with the device isolation pattern 120a illustrated in FIG. 5 or the device isolation pattern 120b illustrated in FIG. 6 or the device isolation pattern 120c illustrated in FIG. 7.

Hereinafter, semiconductor devices having the device isolation pattern according to various embodiments described herein used in, for example, a dynamic random access memory (DRAM) will be described. Semiconductor devices according to various embodiments described herein may also be used in other memory devices different from the DRAM or in other non-memory devices.

Figure 23:
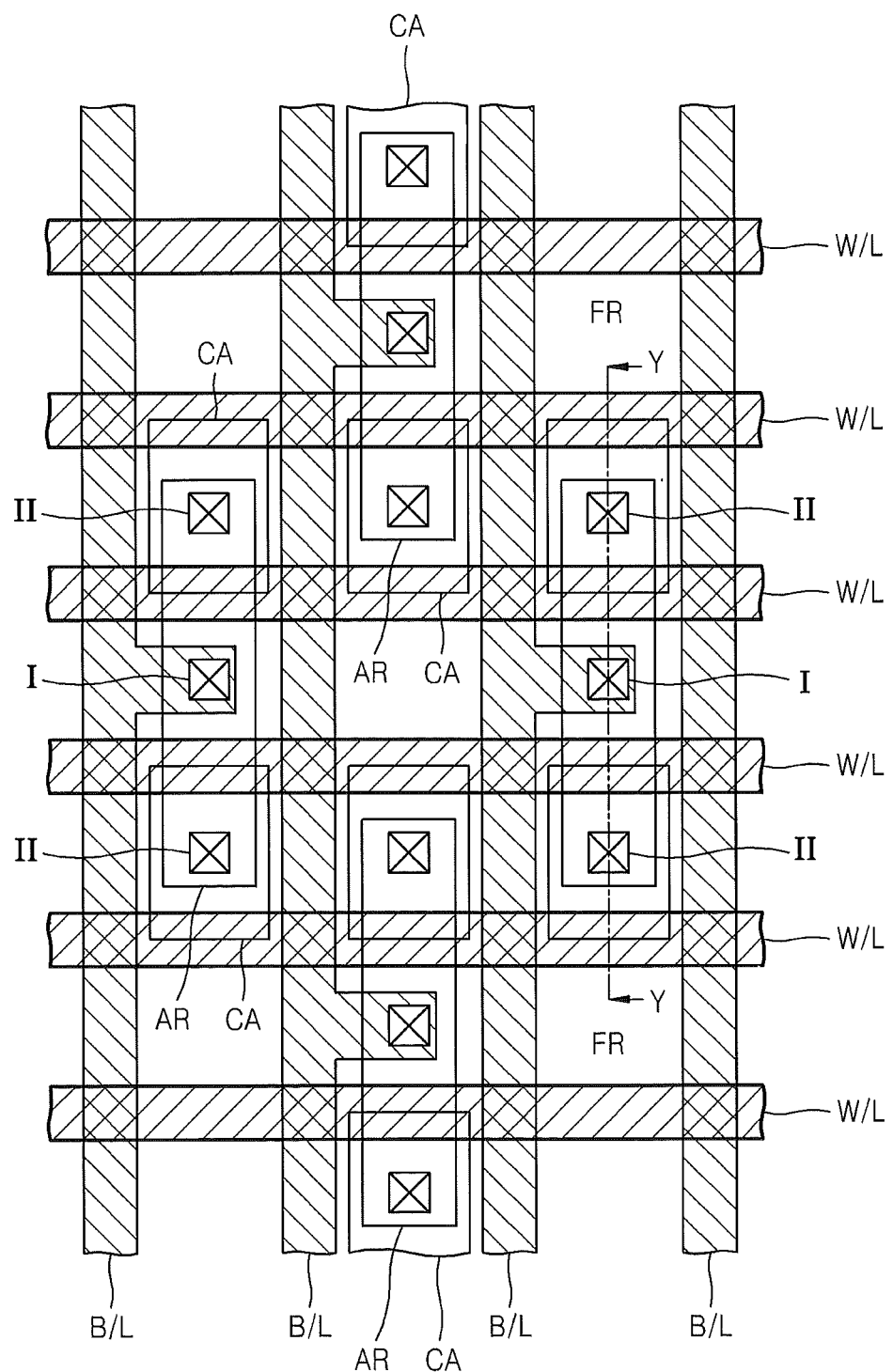
FIG. 23 is a layout diagram illustrating a dynamic random access memory (DRAM) device in which a semiconductor device according to various embodiments described herein may be used.

FIG. 23 is a layout diagram illustrating a DRAM device in which a semiconductor device according to various embodiments described herein is used.

In detail, FIG. 23 illustrates a layout diagram of a DRAM device, but various embodiments described herein are not limited thereto. An active region AR is defined by a non-active region (field region, FR), and two word lines W/L pass over the active region AR. A bit line B/L is arranged in different layers from the word line W/L. The word line W/L is arranged in a first direction, and the bit line B/L is arranged in a second direction that is different from the first direction of the word line W/L, for example, in a perpendicular direction thereto.

A direct contact (DC) pad electrode I, to which the bit line B/L is connected, is provided on a drain region formed in the active region AR, and a buried contact (BC) contact pad electrode II, to which a bottom electrode is connected, is provided on a source region in the active region AR. A capacitor CA of the DRAM device, that is, bottom electrode, is provided on the BC contact pad electrode II.

Figure 24:
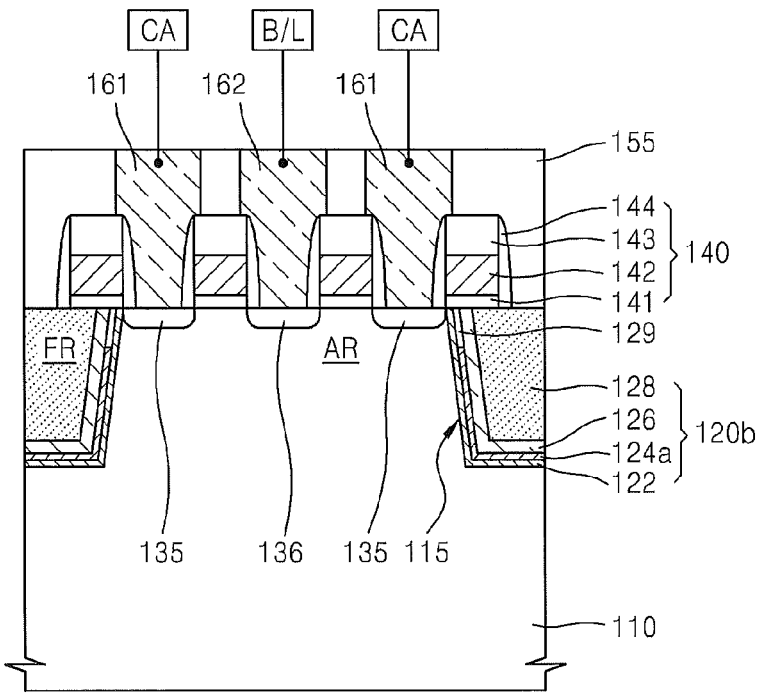
FIGS. 24 and 25 are cross-sectional views illustrating the DRAM device of FIG. 23 cut along a Y-Y direction.
Figure 25:
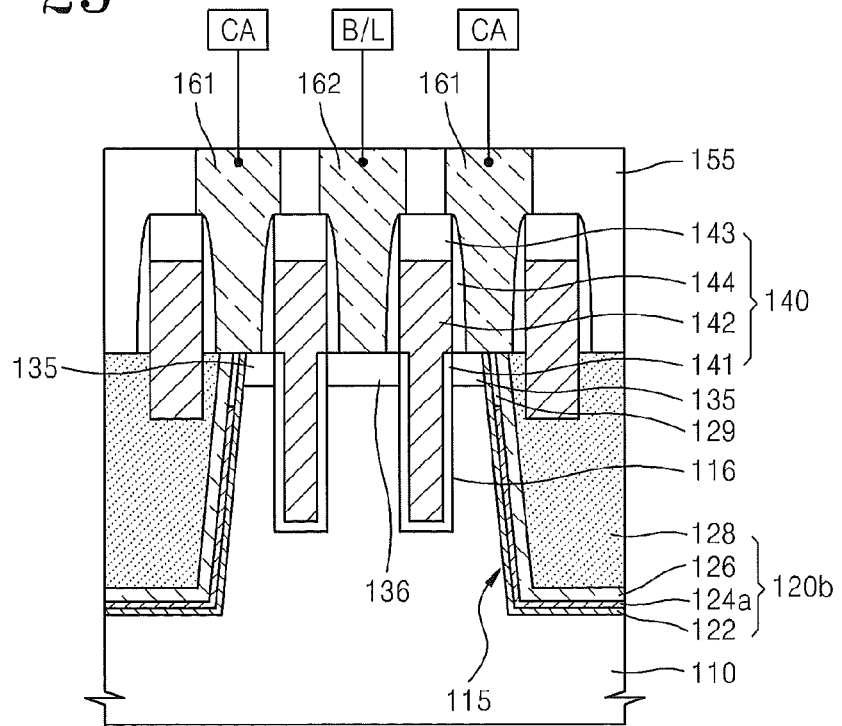

FIGS. 24 and 25 are cross-sectional views illustrating the DRAM device of FIG. 23 cut along a Y-Y direction.

In detail, FIGS. 24 and 25 illustrate examples of the cross-sectional views of the DRAM device, and various embodiments described herein are not limited thereto. FIG. 24 illustrates a DRAM device having a planar channel array transistor, and FIG. 25 illustrates a DRAM device having a recessed channel array transistor.

The active region AR defined by the non-active region FR is provided on the semiconductor substrate 110, for example, on a silicon and/or other semiconductor substrate. The non-active region FR is formed by forming a device isolation pattern 120b in the trench 115 that is formed by etching the semiconductor substrate 110.

Meanwhile, the device isolation pattern 120b illustrated in FIG. 24 includes the device isolation pattern 120n illustrated in FIG. 6. A polysilicon layer pattern 124a is spaced apart from the upper surface of a semiconductor substrate 110, and a space 129 corresponding to a gap between the polysilicon layer pattern 124a and the upper surface of the semiconductor substrate 110 may be a closed space filled with air or may be filled with an insulating material.

However, the device isolation pattern 120b illustrated in FIG. 24 is not limited thereto. For example, according to various embodiments described herein, the device isolation pattern 120b may be replaced with the device isolation pattern 120 illustrated in FIG. 1, the device isolation pattern 120a illustrated in FIG. 5 or the device isolation pattern 120c illustrated in FIG. 7.

A plurality of gate electrode structures 140 performing the function of the word line W/L are provided on the semiconductor substrate 110 on which the active region AR is defined. The gate electrode structures 140 each include a gate insulation layer 141, a gate electrode 142, a gate hard mask layer 143, and a gate spacer layer 144.

Referring to FIG. 25, the gate electrode structures 140 each includes a gate insulation layer 141 on an inner wall of a recess channel trench 116, a gate electrode 142 that buries the recess channel trench 116 and is on the gate insulation layer 141 and the semiconductor substrate 110, a gate hard mask layer 143 on the gate electrode 142, and a gate spacer layer 144.

Meanwhile, the device isolation pattern 120b illustrated in FIG. 25 includes the device isolation pattern 120b illustrated in FIG. 6. A polysilicon layer pattern 124a is spaced apart from an upper surface of a semiconductor substrate 110, and a space 129 corresponding to a gap between the polysilicon layer pattern 124a and the upper surface of the semiconductor substrate 110 may be a closed space filled with air or may be filled with an insulating material.

However, the device isolation pattern 120b illustrated in FIG. 24 is not limited thereto. For example, the device isolation pattern 120b of FIG. 25 may be replaced with the device isolation pattern 120 illustrated in FIG. 1, the device isolation pattern 120a illustrated in FIG. 5, or the device isolation pattern 120c illustrated in FIG. 7. The gate hard mask layer 143 may comprise a silicon nitride layer having an excellent selectivity with respect to a silicon oxide layer that is used as an interlayer insulation layer pattern 155. The gate spacer layer 144 may comprise a silicon nitride layer having a high selectivity with respect to a silicon oxide layer that is used as the interlayer insulation layer pattern 155.

Impurity regions 135 and 136, that is, a source region 135 and a drain region 136, are respectively provided below two side walls of the gate electrode structures 140. The impurity regions 135 and 136 are provided in portion of the semiconductor substrate 110 between the gate electrode structures 140.

Contact pad electrodes 161 and 162 are provided on the semiconductor substrate 110 between the gate spacer layers 144. The contact pad electrodes 161 and 162 are between the gate electrode structures 140 on the impurity regions 135 and 136. The contact pad electrodes 161 and 162 are insulated using the interlayer insulation layer pattern 155. The interlayer insulation pattern 155 comprises a silicon oxide layer. The contact pad electrodes 161 and 162 are classified as the DC pad electrode 162 and the BC contact pad electrode 161, as described above. The bit line B/L and the capacitor CA are connected to the DC pad electrode 162 and the BC contact pad electrode 161, respectively.

Hereinafter, a semiconductor device including a device isolation pattern according to various embodiments described herein used in, for example, a fin FET will be described.

Figure 26:
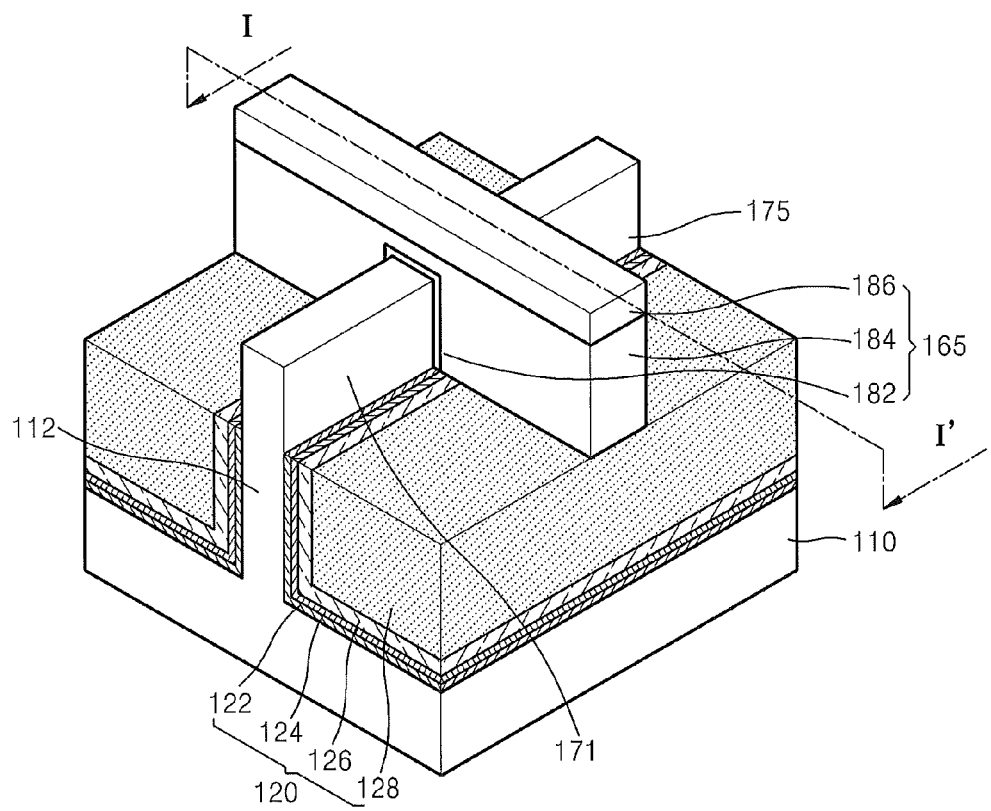
FIG. 26 is a perspective view illustrating a fin field effect transistor (FET) having a device isolation pattern according to various embodiments described herein.
Figure 27:
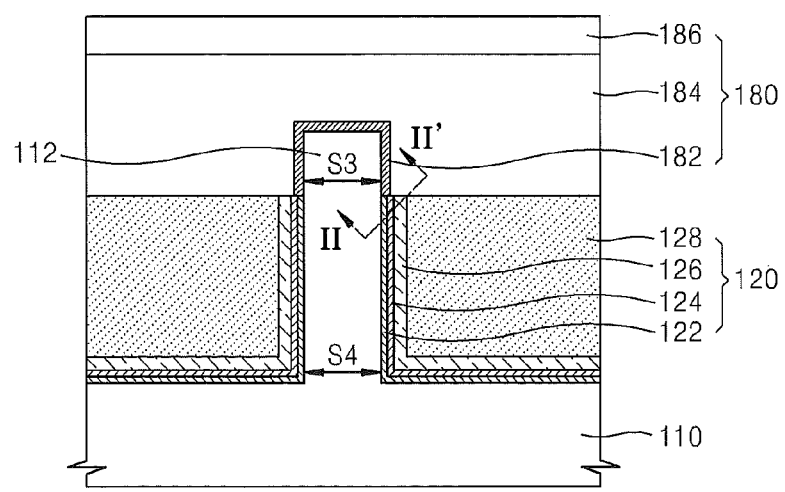
FIG. 27 is a cross-sectional view illustrating the fin FET of FIG. 26 cut along a line I-I'.

FIG. 26 is a perspective view illustrating a fin field effect transistor (FET) having a device isolation pattern according to various embodiments described herein, and FIG. 27 is a cross-sectional view illustrating the fin FET of FIG. 26 cut along a line I-I'.

Referring to FIGS. 26 and 27, an active pattern 112 is provided as a single unit with a semiconductor substrate 110 and is protruded from a surface of the semiconductor substrate 110. The active pattern 112 is extended in a first direction. The active pattern 112 may have a trapezoidal pattern having a width that is reduced in an upward direction from the surface of the semiconductor substrate 110. That is, the active pattern 112 may have an upper width S3 that is smaller than a lower width S4. However, a cross-section of the active pattern 112 is not limited thereto, and may have any of other various shapes.

Meanwhile, a pad oxide layer (not shown) and a hard mask pattern (not shown) may be further provided on the active pattern 112. A device isolation pattern 120 is provided on the semiconductor substrate 110 to separate the active pattern 112. The device isolation pattern 120 may include, as illustrated in FIG. 1, an oxide layer pattern 122, a polysilicon layer pattern 124, a nitride layer pattern 126, and an insulation layer pattern 128 provided on a surface of a trench.

The device isolation pattern 120 has been described above in detail with respect to FIG. 1, and thus description thereof will be omitted. The device isolation pattern 120 is provided up to a predetermined height of the active pattern 112, and thus a portion of the active pattern 112 protrudes from the device isolation pattern 120. The portion of the active pattern 112 protruding from the device isolation pattern 120 corresponds to a height of a channel. A gate electrode structure 165 that surrounds the active pattern 112 protruded from the device isolation pattern 120 and that is extended in a second direction is formed. The gate electrode structure 165 includes a gate insulation layer 182 on two side walls of the active pattern 112, a gate electrode 184 that surrounds the gate insulation layer 182 and the active pattern 112 and is extended in a second direction, and a hard mask pattern 186 on the gate electrode 184. The gate insulation layer 182 may be provided not only on the two side walls of the active pattern 112 but also on an upper surface of the active pattern 112. Source and drain regions 171 and 175 in which impurities of a predetermined conductivity type are injected are provided in protruded portions of the active pattern 112 of the gate electrode structure 165.

The fin FET has a structure in which the gate electrode 184 surrounds the silicon active pattern 112 three-dimensionally, and the device isolation pattern 120 includes an oxide layer pattern 122, a polysilicon layer pattern 124, a nitride layer pattern 126, and an insulation layer pattern 128. Accordingly, since a polysilicon layer doped with oxygen, carbon, or nitrogen is provided between a channel and a gate electrode, potential walls for both electrons (e−) and holes (h+) are provided in the nitride layer pattern 126, thereby preventing accumulation of charges and variation in the characteristics of the transistor, accordingly.

Figure 28:
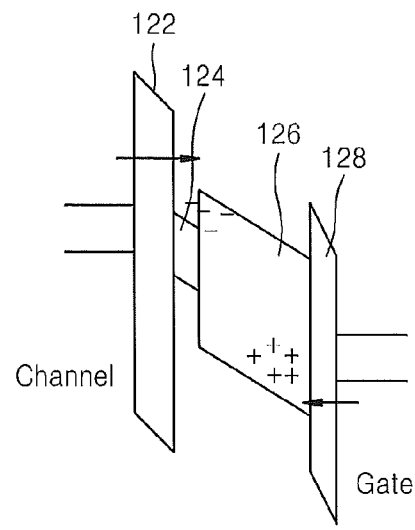
FIG. 28 is a band diagram illustrating a portion of the fin FET cut along a line II-II' of FIG. 27.

FIG. 28 is a band diagram illustrating a portion of the fin FET cut along a line II-II' of FIG. 27.

Referring to FIG. 28, the oxide layer pattern 122, the polysilicon layer pattern 124, the nitride layer pattern 126, and the insulation layer pattern 128 are interposed between the channel formed on the silicon active pattern 112 and the gate electrode 184. When the oxide layer pattern 122 comprises a silicon oxide layer, and the nitride layer pattern 126 comprises a silicon nitride layer, and the insulation layer pattern 128 comprises a silicon oxide layer, a material $SiO_2$—$Si_3N_4$—$SiO_2$ is coupled between the channel and the gate electrode. However, since a polysilicon doped with oxygen, carbon or nitrogen is additionally interposed between the channel and the insulation layer pattern 128, potential walls for both the electrons (e−) and holes (h+) are provided in the nitride layer pattern 126, thereby preventing accumulation of charges and variation in the characteristics of the transistor, accordingly.

The device isolation pattern illustrated in FIGS. 26 and 27 comprises the device isolation pattern 120 illustrated in FIG. 1, but is not limited thereto. For example, the device isolation pattern of FIGS. 26 and 27 may be replaced with the device isolation pattern 120a illustrated in FIG. 5, the device isolation pattern 120b illustrated in FIG. 6 or the device isolation pattern 120c illustrated in FIG. 7.

Figure 29:
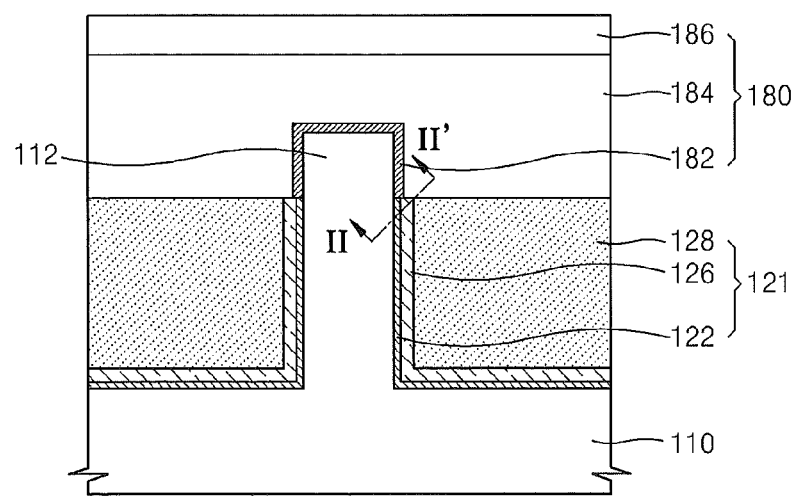
FIG. 29 is a cross-sectional view illustrating a semiconductor device according to a comparative example in comparison with the fin FET of FIG. 27.
Figure 30:
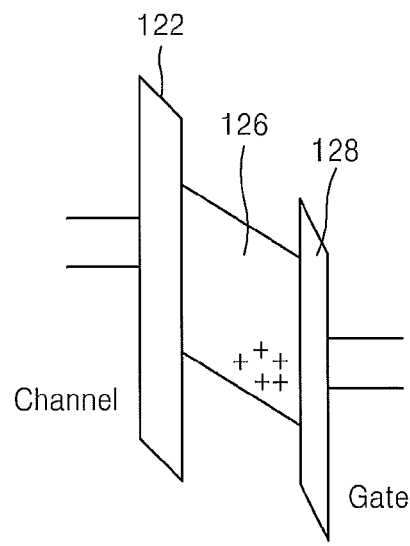
FIG. 30 is a band diagram illustrating the semiconductor device of FIG. 29 cut along a line II-II'.

FIG. 29 is a cross-sectional view illustrating a semiconductor device according to a comparative example in comparison with the fin FET of FIG. 27. FIG. 30 is a band diagram illustrating a portion of the semiconductor device of FIG. 29 cut along a line II-II'.

Referring to FIG. 29, the semiconductor device has the same structure as that illustrated in FIG. 27 except that a polysilicon layer pattern 124 is not provided in a device isolation pattern 121.

An oxide layer pattern 122, a nitride layer pattern 126, and an insulation layer pattern 128 are interposed between a channel on a silicon active pattern 112 and a gate electrode 184. When the oxide layer pattern 122 comprises a silicon oxide layer, and the nitride layer pattern 126 comprises a silicon nitride layer, and the insulation layer pattern 128 comprises a silicon oxide layer, a material $SiO_2$—$Si_3N_4$—$SiO_2$ is coupled between the channel and the gate electrode.

When a transistor is operating, electrons (e−) have no difficulty in moving from the channel to the gate electrode. However, holes (h+) that are back-tunneled in the gate electrode are trapped in the nitride layer pattern 126 due to an oxide layer barrier, and this accumulation of charges may vary the characteristics of the transistor.

Consequently, comparing the band diagrams of FIGS. 28 and 30, it can be found that when a polysilicon layer doped with oxygen, carbon or nitrogen is formed in a device isolation pattern, charges are not accumulated in a nitride layer and thus the characteristics of the transistor may be maintained.

Figure 31:
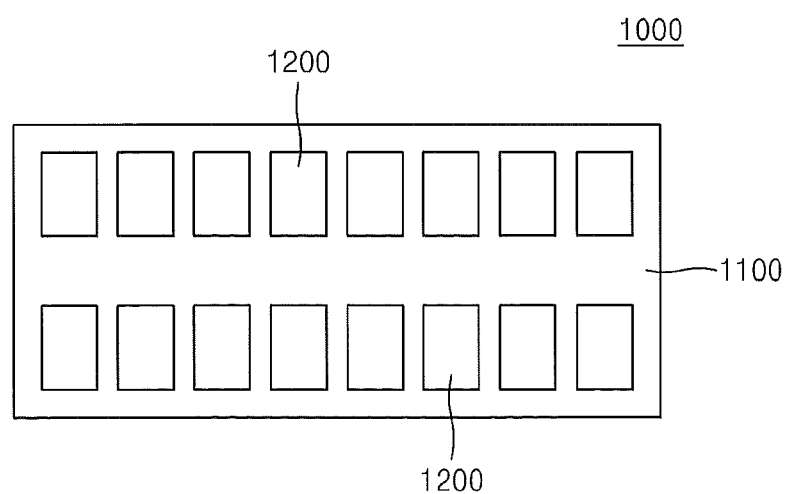
FIG. 31 is a plan view illustrating a memory module including a semiconductor device according to various embodiments described herein.

FIG. 31 is a plan view of a memory module 1000 including a semiconductor device according to various embodiments described herein.

The memory module 1000 may include a printed circuit board 1100 and a plurality of semiconductor packages 1200.

The plurality of semiconductor packages 1200 may include a semiconductor device according to various embodiments described herein. In particular, the plurality of semiconductor packages 1200 may include a structure of at least one of the semiconductor devices according to various embodiments described herein.

The memory module 1000 according to various embodiments described herein may be a single in-line memory module (SIMM) in which the plurality of semiconductor packages 1200 are mounted only on one surface of a printed circuit board or a dual in-line memory module (DIMM) in which the plurality of semiconductor packages 1200 are mounted on two surfaces of a printed circuit board. Also, the memory module 1000 may be a fully buffered DIMM (FBDIMM) including an advanced memory buffer (AMB).

Figure 32:
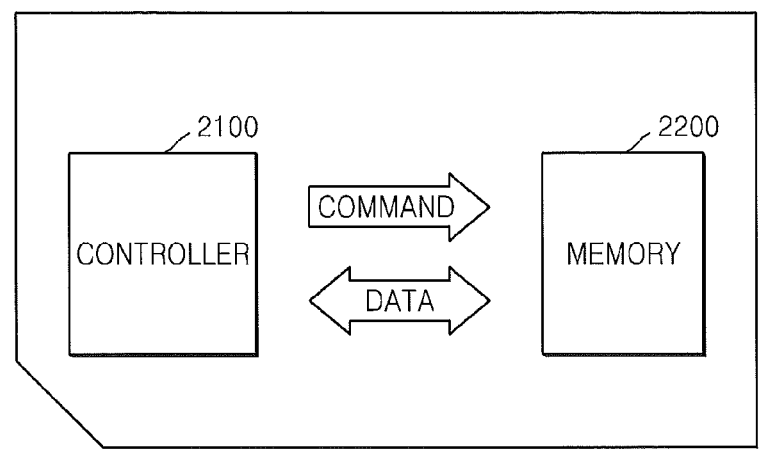
FIG. 32 is a schematic view illustrating a memory card including a semiconductor device according to various embodiments described herein.

FIG. 32 is a schematic view illustrating a memory card 2000 including a non-volatile memory device according to various embodiments described herein.

The memory card 2000 may be arranged such that a controller 2100 and a memory 2200 exchange electrical signals. For example, upon a command by the controller 2100, the memory 2200 may transmit data.

The memory 2200 may include a vertical non-volatile memory device according to various embodiments described herein. In particular, the memory 2200 may include a structure of at least one of the semiconductor devices according to various embodiments described herein.

Examples of the memory card 2000 include a memory stick card, a smart media card (SM), a secure digital card (SD), a mini-secure digital card (mini SD), and a multimedia card (MMC).

Figure 33:
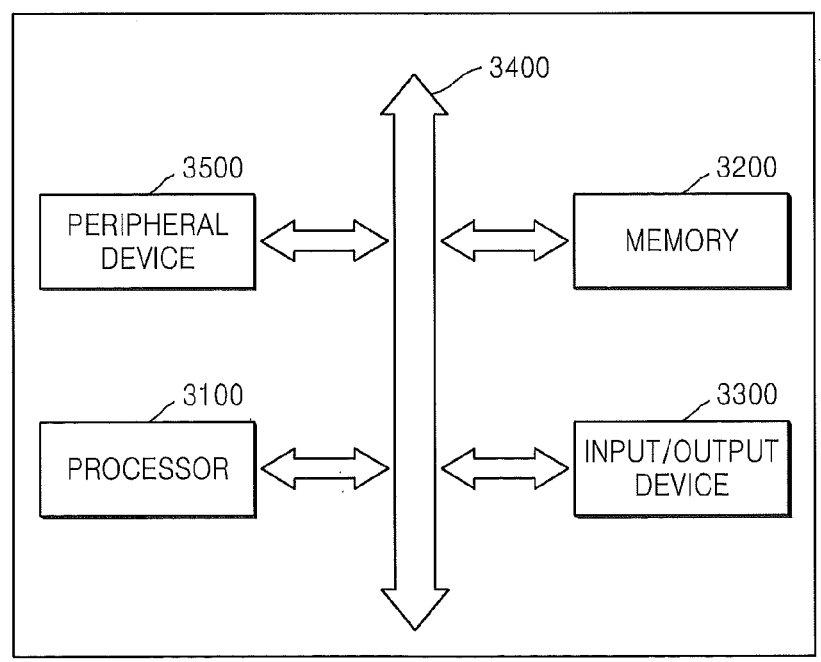
FIG. 33 is a schematic view illustrating a system including a semiconductor device according to various embodiments described herein.

FIG. 33 is a schematic view, illustrating a system 3000 including a semiconductor device according to various embodiments described herein.

In the system 3000, a processor 3100, a memory 3200, and an input/output device 3300 may communicate with one another via a bus 3400.

Examples of the memory 3200 of the system 3000 include a random access memory (RAM) and a read only memory (ROM). The system 3000 may also include a peripheral device 3500 such as a floppy disk drive and a compact disk (CD) ROM drive.

The memory 3200 may include the semiconductor device according to various embodiments described herein. In particular, the memory 3200 may include a structure of at least one of the semiconductor devices according to various embodiments described herein.

The memory 3200 may store codes and data for operating the processor 3100.

The system 3000 may be applied to a mobile phone, an MP3 player, a navigation device, a portable multimedia player (PMP), a solid state disk (SSD) and/or household appliances.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor device comprising:
a semiconductor substrate including a trench therein;
a polysilicon liner covering a bottom surface and sidewalls of the trench;
a nitride liner covering the polysilicon liner; and
a gap-fill insulation layer on the nitride liner, the gap-fill insulation layer having a lower surface and a side surface being surrounded by the polysilicon liner and the nitride liner,
wherein the polysilicon liner is doped with impurities,
wherein the gap-fill insulation layer pattern fills the trench, and
wherein the trench further comprises a trench opening and wherein the polysilicon liner on the sidewalls of the trench is recessed from the trench opening.

2. The semiconductor device of claim 1, wherein the polysilicon liner is doped with oxygen.

3. The semiconductor device of claim 1, wherein the polysilicon liner is doped with carbon.

4. The semiconductor device of claim 1, wherein the polysilicon liner is doped with nitrogen.

5. The semiconductor device of claim 1, further comprising an oxide liner interposed between the surface of the trench and the polysilicon liner.

6. The semiconductor device of claim 1, further comprising a gate electrode structure on the semiconductor substrate.

7. The semiconductor device of claim 1, further comprising a p-type metal oxide semiconductor field effect transistor (pMOSFET) in and/or on the semiconductor substrate.

8. A semiconductor device, comprising:
a semiconductor substrate including a trench therein;
a gate electrode structure on the semiconductor substrate; and
a device isolation pattern in the trench,
wherein the device isolation pattern comprises:
a polysilicon liner covering a bottom surface and sidewalls of the trench;
a nitride liner covering the polysilicon liner; and
a gap-fill insulation layer on the nitride liner, the gap-fill insulation layer having a lower surface and a side surface being surrounded by the polysilicon liner and the nitride liner,
wherein the polysilicon liner is doped with impurities,
wherein the gap-fill insulation layer pattern fills the trench, and
wherein the trench comprises a trench opening, and the polysilicon liner on the sidewalls of the trench is recessed from the trench opening.

9. The semiconductor device of claim 8, wherein the gate electrode structure comprises:
a gate insulation layer on the semiconductor substrate; and
a gate electrode on the gate insulation layer.

10. The semiconductor device of claim 8, wherein the semiconductor substrate also includes a recessed channel trench therein and wherein the gate electrode structure comprises:
a gate insulation layer inside the recessed channel trench; and
a gate electrode on the gate insulation layer that is in the recessed channel trench, and on the semiconductor substrate.

11. The semiconductor device of claim 8, wherein the semiconductor substrate further comprises an active pattern that protrudes from an upper surface of the semiconductor substrate and extends in a first direction,
wherein the gate electrode structure comprises:
a gate insulation layer on two side surfaces of the active pattern; and
a gate electrode that surrounds the gate insulation layer on the active pattern and extends in a second direction.

* * * * *